United States Patent

Hatashita et al.

Patent Number: 5,212,828
Date of Patent: May 18, 1993

[54] RECEIVER APPARATUS

[75] Inventors: Hiroshi Hatashita; Toshio Nagashima; Tomomi Matsumoto, all of Yokohama, Japan

[73] Assignee: Hitachi, Ltd., Tokyo, Japan

[21] Appl. No.: 625,978

[22] Filed: Dec. 11, 1990

[30] Foreign Application Priority Data

Dec. 15, 1989 [JP] Japan ................................. 1-323706

[51] Int. Cl.$^5$ ............................................. H04B 1/10
[52] U.S. Cl. ................................... 455/295; 455/317; 455/326; 455/339
[58] Field of Search ........ 455/317, 339, 326, 188–191, 455/114, 316, 249.1, 188.1, 188.2, 191.1, 191.2, 295

[56] References Cited

U.S. PATENT DOCUMENTS

| | | | |
|---|---|---|---|
| 4,592,095 | 5/1986 | Ohnishi et al. | 455/317 |
| 4,661,995 | 4/1987 | Kashiwagi | 455/317 |
| 4,688,263 | 8/1987 | Aldridge | 455/326 |
| 4,756,024 | 7/1988 | Kupler | 455/339 |
| 4,843,637 | 6/1989 | Shimura et al. | 455/249.1 |

FOREIGN PATENT DOCUMENTS 60-80325  8/1985  Japan .

Primary Examiner—Reinhard J. Eisenzopf
Assistant Examiner—Edward Urban
Attorney, Agent, or Firm—Fay, Sharpe, Beall, Fagan, Minnich & McKee

[57] ABSTRACT

A receiver apparatus having a mixer circuit, an oscillator circuit and a tuner circuit is provided with a trap circuit, interposed between the tuner circuit and the mixer circuit, for removing disturbing mutual modulation waves generated by receiving two or more RF signals. Further, the mixer circuit employs a double balanced mixer structure to offset two or more disturbing mutual modulation waves.

4 Claims, 5 Drawing Sheets

RECEIVER APPARATUS

BACKGROUND OF THE INVENTION

The present invention relates to a receiver apparatus such as a tuner or the like for receiving television signals or CATV signals, and more particularly, to a tuner circuit having a favorable anti-disturbance characteristic.

Conventional tuner circuits for receiving television signals are generally provided with a trap circuit arranged in an input tuner circuit thereof for removing a beat disturbance caused by an FM broadcasting wave or the like, as described in Official Gazette of Japanese Laid-open Patent No. 80325/1985.

SUMMARY OF THE INVENTION

The above-mentioned prior art is effective when the frequency of a received signal is far away from that of a spurious signal which may disturb images or the like. However, if the frequency of a received signal is close to that of a spurious signal as an FM signal disturbance affecting a reception of the sixth channel of the U.S. channel system, a large amount of a trap attenuation in an input tuner circuit causes an increase in loss of a received signal.

It is an object of the present invention to provide a receiver apparatus such as a tuner which is capable of solving the above-mentioned problem and exhibiting a favorable anti-disturbance performance even when the frequency of a received signal is close to that of a spurious signal.

To achieve the above object, the present invention provides a trap circuit between an inter-stage circuit and a mixer circuit of a tuner for attenuating a mutual modulation signal which causes a disturbance and also employs a double balanced mixer which exhibits a favorable anti-disturbance performance for the mixer circuit.

Upon receiving the sixth channel of the U.S. channel system, since the FM signal frequency is extremely close, this FM signal cannot be removed by a trap circuit arranged in an input tuner circuit of a receiver apparatus as before. For this reason, the receiver apparatus inevitably simultaneously receives the FM signal when a signal at the sixth channel is received. If two or more signals are thus received at the same time, a mutual modulation wave is produced in a nonlinear element arranged at a location from an input circuit to an inter-stage circuit of the receiver apparatus.

The present invention is adapted to remove a spurious signal produced in an IF band caused by the received two signals (RF signals) and a local oscillation signal of a receiver apparatus. The spurious signal is produced when a mutual modulation wave produced in a nonlinear element from an input circuit to an inter-stage circuit on the basis of the received two signals is converted to an IF band by a local oscillation signal in a mixer circuit, and when the respective signals are converted to the IF band in the mixer circuit. In the former case, a trap circuit arranged between the inter-stage tuner circuit and the mixer circuit attenuates mutual modulation wave components to improve the anti-disturbance performance, while in the latter case, a double balanced structure is employed for the mixer circuit to improve the anti-disturbance performance.

Further, the above structure also produces an effect of offsetting the mutual modulation wave components produced up to the inter-stage tuner circuit and the mutual modulation wave components produced by the mixer circuit in a double balanced structure, which results in further improving the anti-disturbance performance.

DESCRIPTION OF THE PREFERRED EMBODIMENTS

A first embodiment of the present invention will hereinafter be explained with reference to FIG. 1.

Figure 1:
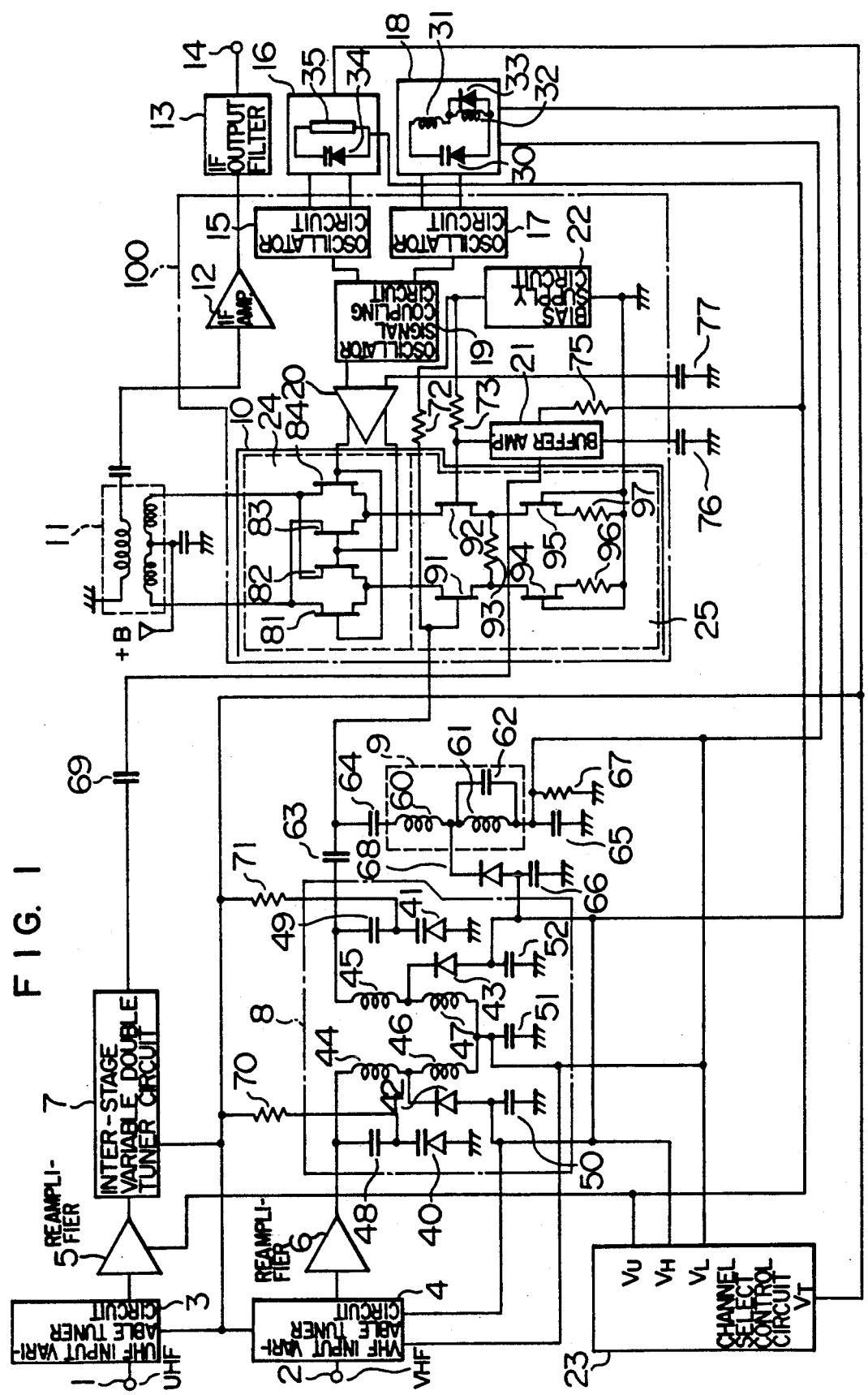
FIG. 1 is a block diagram showing a first embodiment of the present invention.

FIG. 1 shows a first embodiment of the present invention and specifically shows a circuit diagram of a tuner for receiving television signals.

Reference numeral 1 designates a UHF signal input terminal, 2 a VHF signal input terminal, 3 and 4 input variable tuner circuits respectively for UHF and VHF, 5 and 6 RF amplifiers respectively for UHF and VHF, 7 and 8 inter-stage variable double tuner circuits for UHF and VHF, and 9 a trap circuit according to the present invention.

Further, reference numeral 10 designates a mixer circuit, 11 an IF filter, 12 an IF amplifier circuit, 13 an IF output filter, 14 an IF output terminal. Also, reference numeral 15 designates a UHF oscillator circuit, 16 a UHF oscillator variable resonance circuit, 17 a VHF oscillator circuit, 18 a VHF oscillator variable resonance circuit, 19 an oscillation signal coupling circuit, 20 an oscillation amplifier circuit, 21 a buffer amplifier, 22 a bias supply circuit, and 23 a channel select control circuit.

A UHF signal is inputted from the UHF signal input terminal 1 and supplied through the UHF tuner circuit and the buffer amplifier 21 to the mixer circuit 10 wherein the UHF signal is converted to an IF signal by a UHF oscillating signal. The IF signal is outputted from the IF output terminal 14 through the IF filter 11, the IF amplifier circuit 12 and the IF output filter 13. A VHF signal or a CATV signal, on the other hand, is inputted from the VHF signal input terminal 2 and supplied through a VHF tuner circuit to the mixer circuit 10 wherein it is converted by a VHF oscillating signal to an IF signal which in turn is outputted from the IF output terminal 14 through the IF filter 11, the IF amplifier circuit 12 and the IF output filter 13.

The mixer circuit 10 comprises a double balanced mixer 24 and an RF differential amplifier circuit 25, while the VHF oscillator variable resonance circuit 18 comprises a variable capacitance diode 30, a VHF high band coil 31, a VHF low band coil 32 and a switching diode 33, wherein the coils are changed over by a band voltage from the channel select control signal 23 to change an oscillation frequency band, and also the capacitance of the variable capacitance diode 30 is changed by a channel selection voltage to vary an oscillation frequency. The UHF oscillator variable resonance circuit 16 comprises a variable capacitance diode 34 and a resonance inductor 35 wherein the capacitance of the variable capacitance diode 34 is changed by a channel selection signal to vary an oscillation frequency. The inter-stage variable double tuner circuit 8 comprises variable capacitance diodes 40, 41, switching diodes 42, 43, VHF high band coils 44, 45, VHF low band coils 46, 47 and capacitors 48-52, wherein the coils are changed over by turning on and off the switching diodes to change a received frequency band, and the capacitance of the variable capacitance diodes is changed to vary a tuned frequency.

Figure 2:
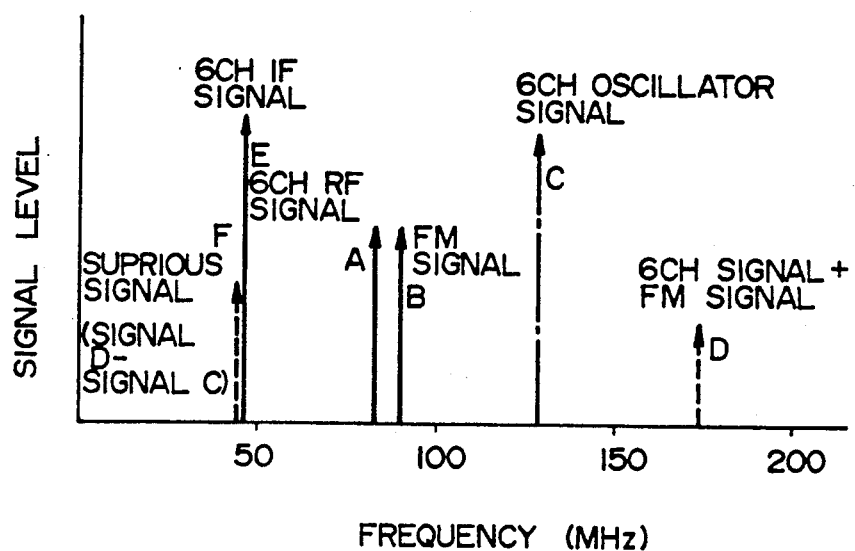
FIG. 2 is a diagram used for explaining a procedure of occurrence of a disturbance.

Next, a generating mechanism of an example of a disturbance which is removed by the present invention and the action of the present invention against such disturbance will be explained in detail FIG. 2 shows a case where a U.S. sixth channel signal (a video carrier frequency Fp: 83.25 MHz, an audio subcarrier frequency Fs: 8.5 MHz, an oscillating frequency Fosc: 129 MHz) is received, and an FM educational broadcast signal (a frequency Fm: 88.1–91.9 MHz) is disturbing the U.S. sixth channel signal, wherein reference letter A designates a video carrier signal of the sixth channel, B an FM signal, C an oscillation signal of the sixth channel, D a sum signal of the signals A and B, E an IF signal of the video carrier of the sixth channel, and F a difference signal between the signals D and C. The signal F, that is, a beat signal component Fs+Fm−Fosc is generated in the vicinity of the received IF signal and causes a disturbance. For example, if an FM signal is at 91 MHz, the signal F is at 45.25 MHz, whereby a beat disturbing component of 0.5 MHz is generated against the IF signal of the sixth channel video carrier at 45.75 MHz, and therefore the image quality is deteriorated. Such a disturbing component is generated mainly by two processes which are mentioned below.

One is that a nonlinear element such as a variable capacitance diode or the like generates the above-mentioned sum signal of a video carrier signal of the sixth channel and an FM signal and then the sum signal is converted to the IF band by the oscillating signal in the mixer circuit. The other is that the disturbing component is generated in the mixer circuit by the above-mentioned three signals of a video carrier signal of the sixth channel, an FM signal and the oscillating signal. In the latter case, it is necessary to improve the performance of the mixer circuit, while in the former case, the performance can be improved by attenuating the sum signal component in stages before the mixer circuit.

Figure 3A:
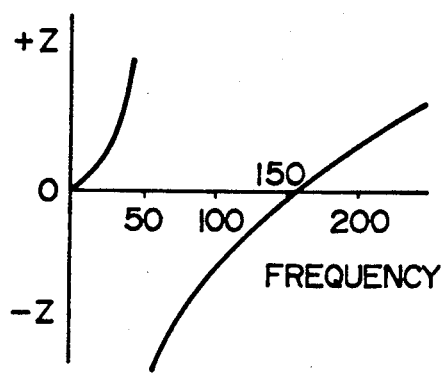
FIGS. 3A and 3B are characteristic diagrams used for explaining a trap circuit of the present invention.
Figure 3B:
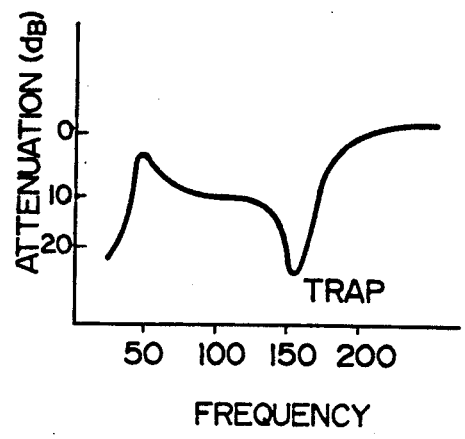

The trap circuit 9 shown in FIG. 1 is provided for attenuating the sum signal component, the operation of which will be next explained. In the trap circuit 9, reference numerals 60, 61 designate coils, 62–66 capacitors, 67 a resistor and 68 a switching diode. Generally, the capacitor 63 is chosen to be a small capacitance, and the coils 60, 61 are changed over by the switching diode 68 to match the tuner circuit and the mixer circuit in a low frequency region of the respective low and high bands to reduce a loss. However, in the present invention, the sum signal trap circuit 9 is formed merely by connecting the capacitor 62 in parallel with the coil 61. FIG. 3A shows a reactance characteristic of the trap circuit 9 and FIG. 3B an attenuation characteristic of the same, from which it is understood that the trap circuit 9 attenuates a sum signal component in the vicinity of 10 MHz by more than 10 dB and improves the anti-disturbance performance.

The double balanced mixer 24 is composed of FETs 81-84, while the RF differential amplifier circuit 25 has differential amplifier FETs 91 and 92. A resistor for improving the linearity is connected between the sources of the FETs 91, 92, the gates of which are grounded. FETs 94, 95 for a constant current source are respectively connected to resistors 96, 97 for determining a current value thereof, whereby a supplied current is determined. A gate bias for the FETs 91, 92 is determined by the bias supply circuit 22 through resistors 72, 73. The buffer amplifier is also utilized as a switch circuit, wherein reference numeral 75 designates a bias resistor for a change-over operation and 76 a capacitor for the ground. These elements have functions of amplifying a received UHF signal and transmitting the same to the RF differential amplifier circuit 25, and grounding the gate of the FET 92 in a high frequency manner when a VHI. signal is received. Further, reference numeral 77 designates a high frequency ground capacitor for converting an inbalanced oscillation signal to a balanced signal.

Incidentally, in the embodiment shown in FIG. 1, a portion of the circuit surrounded by a one-dot chain line 100 is formed by an integrated circuit.

Next, the operation of the mixer circuit 10 will be explained. When a VHF signal is inputted to the gate of the FET 91 constituting the RF differential amplifier circuit 25, the gate of the FET 92, coupled therewith to form a pair is grounded in a high frequency manner by the buffer amplifier 21 which is utilized also as a switching circuit, whereby amplified and balancedly converted RF signals respectively having an identical amplitude and a substantially opposite phase to each other are outputted from the drains of the FETs 91, 92. The double balanced mixer 24 is fed with VHF oscillation signals respectively having a substantially opposite phase to each other and an identical amplitude. Two pairs of the FETs 81 and 83, 82 and 84, which are applied with the RF signals and the oscillation signals both in opposite phases to each other, have their respective drains connected to form an output terminal. The pair of FETs 81 and 83 are applied with the RF signals in the opposite phase to each other at the respective sources thereof and the oscillation signals in the opposite phases to each other at the respective gates thereof, whereby converted IF signals in the same phase (a sum or difference component of the oscillation signal frequency and the RF signal frequency) are outputted from the respective drains of the FETs 81 and 83. In the other pair of FETs 82 and 84 of the double balanced mixer 24, the RF signals and the oscillation signals are frequency-converted to output IF signals in phases opposite to those outputted from the FETs 81 and 83.

Next, explanation will be given of a characteristic relative to removing a third distortion disturbance which is caused by the two RF signals and the oscillation signal in the event of the frequency conversion operation.

In the FETs 81 and 83 of the double balanced mixer 24, a third distortion having components Fs+Fm Fosc and so on is generated by a third distortion coefficient of the respective FETs from two spurious signals in opposite phases and the two oscillation signals in opposite phases. At this time, in the FETs 81 and 83, since a third distortion component is also generated due to a multiplication of the oscillation signals and the RF signals in opposite phases, the third distortion components in opposite phases having an identical amplitude are generated at the drains of the FETs 81 and 83, respectively. Since the FETs 81 and 83 have the respective drains connected with each other, the third distortion components are not generated in the double balanced mixer 24 as a principle.

Thus, a mixer circuit in a double balanced mixer structure is considerably effective in improving an anti-distortion performance. Therefore, if such double balanced mixer circuit is combined with a filter circuit (a trap circuit) for attenuating mutual modulation components generated in the tuner circuit, a tuner exhibiting a favorable anti-disturbance characteristic can be provided. Further, the double balanced mixer structure can produce an additional effect of offsetting distortion components in the IF band of the mutual modulation components generated in the tuner circuit and distortion components generated in the mixer circuit, which results in further improving the anti-distortion characteristic.

Figure 4:
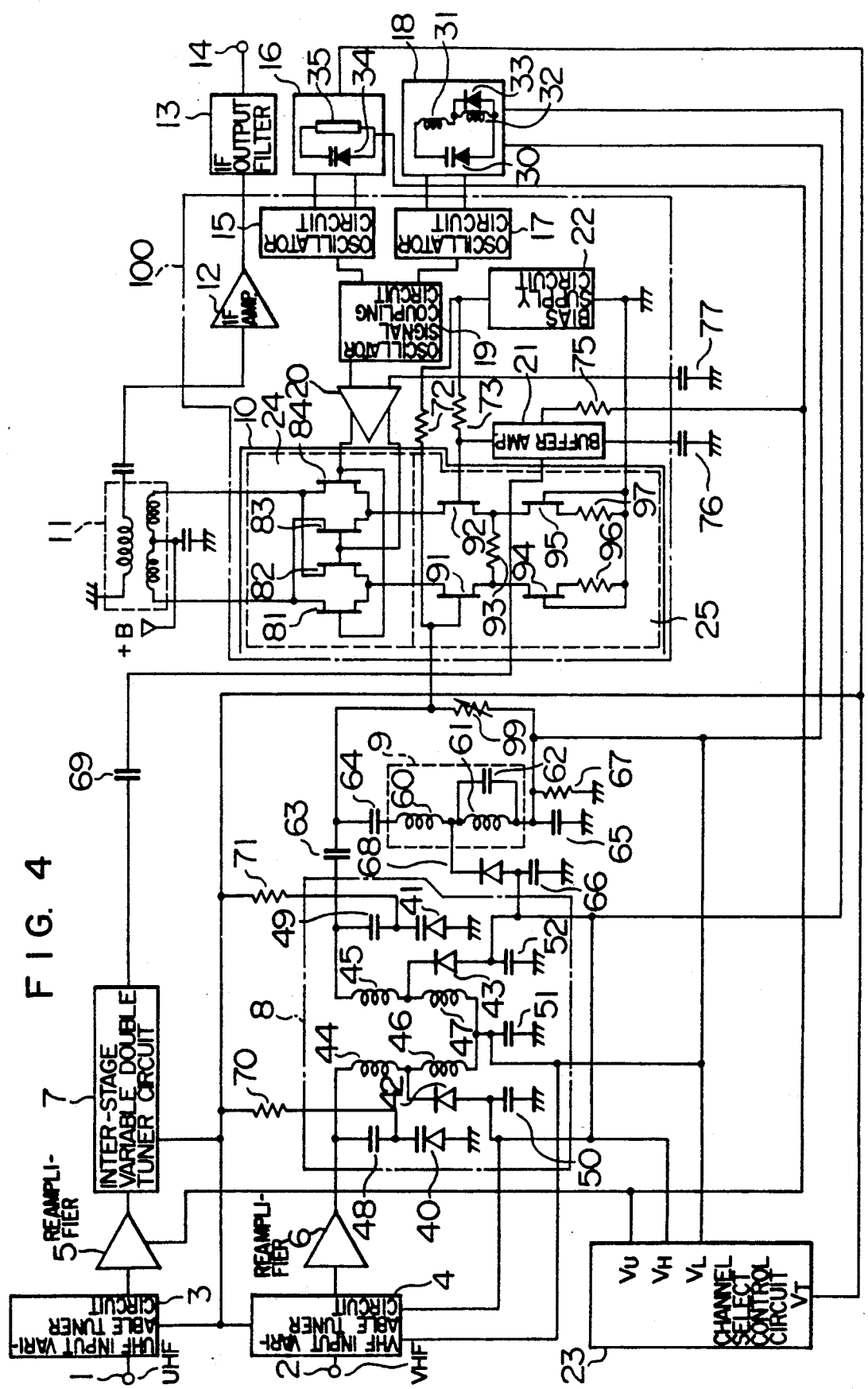
FIG. 4 is a block diagram showing a second embodiment of the present invention.

FIG. 4 shows a second embodiment of the present invention. In FIG. 4, parts for operating the same functions as those in FIG. 1 are designated by the same reference numerals. A difference between FIG. 4 and FIG. 1 is that an input terminal of a mixer circuit is provided with a variable resistor 99.

In the mixer circuit, a third distortion disturbance removing characteristic varies due to variation or the line in pairs of FETs. In the embodiment shown in FIG. 4, the resistor 99 offsets a bias of an RF differential amplifier circuit 25 negatively or positively to reduce the third distortion components generated in a double balanced mixer 25 to a minimum, which results in presenting the most favorable anti-distortion performance of the mixer circuit and further improving the anti-distortion performance of the tuner.

Figure 5:
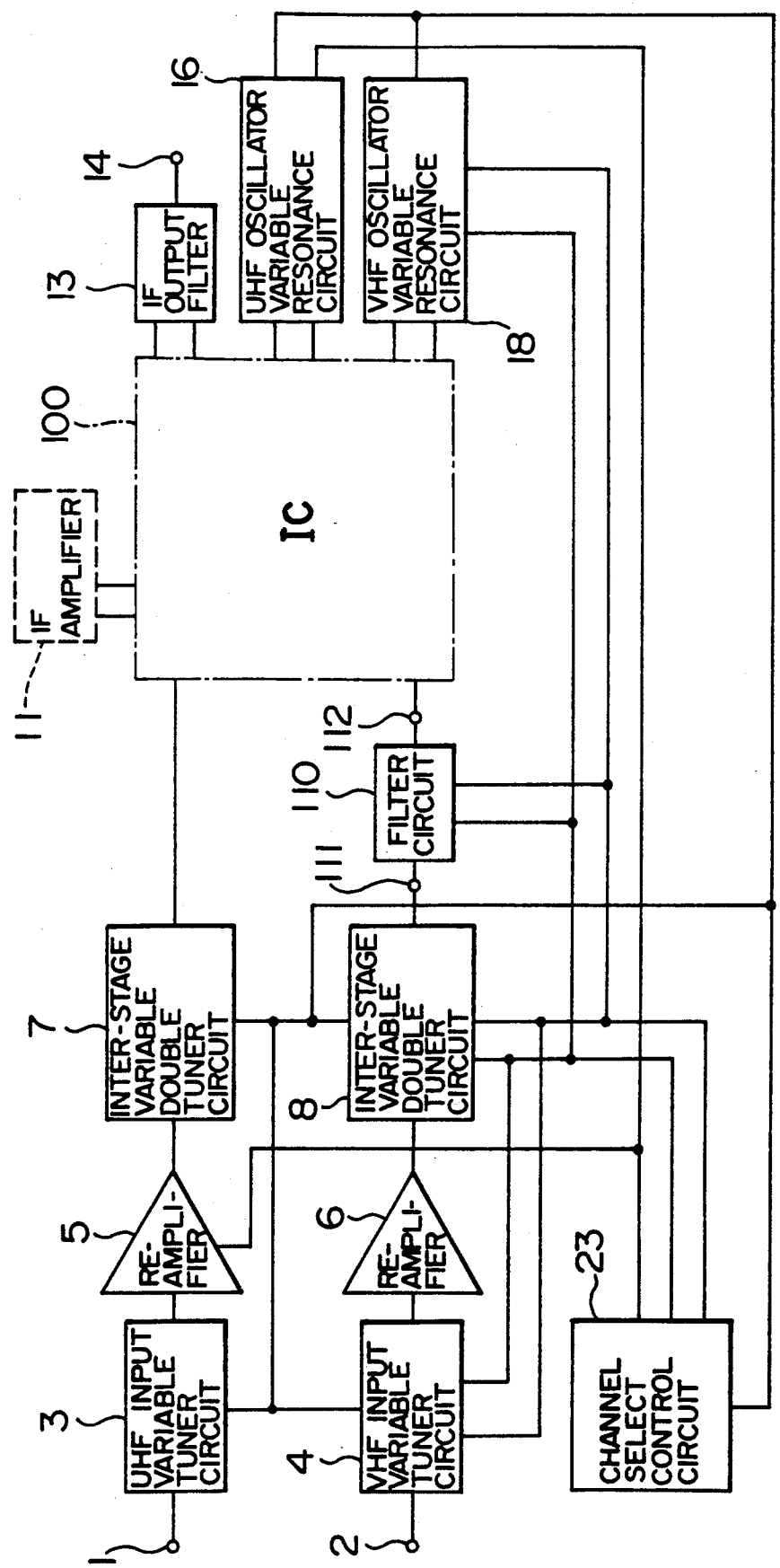
FIG. 5 is an ordinary block diagram showing a receiver apparatus of the present invention.

FIG. 5 is a circuit block diagram showing an ordinary circuit arrangement of the receiver apparatus according to the present invention. Also in FIG. 5, parts for operating the same functions as those in FIG. 1 are designated with the same reference numerals. Reference numeral 100 designates an IC (Integrated Circuit) having the same functions as that in FIG. 1. Reference numeral 110 designates a filter circuit or a trap circuit provided for attenuating a mutual modulation wave in a received signal or a spurious signal. Reference numerals 111, 112 designate input and output terminals of the filter circuit 110, respectively.

Figure 6:
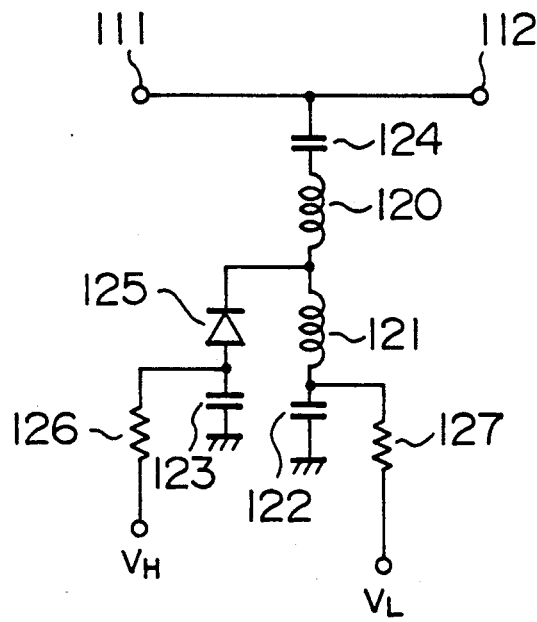
FIGS. 6, 7A and 7B are circuit diagrams respectively showing other embodiments of a trap circuit of the present invention.

FIG. 6 shows a second embodiment of the trap circuit, wherein reference numerals 120 121 designate coils, 122–124 capacitors, 125 a switching diode and 126, 127 resistors. The series resonance circuit formed of coils 120, 121 and the capacitor 122 constitutes a trap circuit.

Figure 7A:
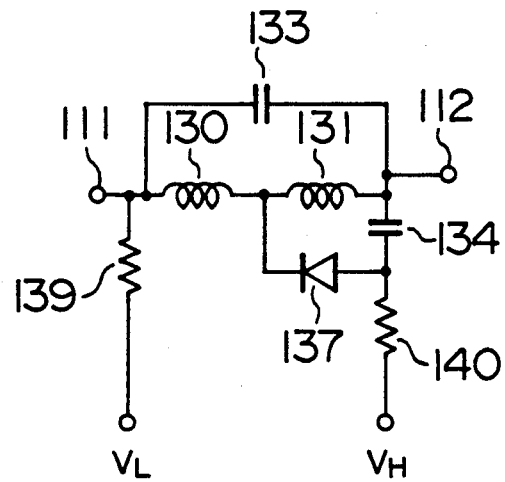
Figure 7B:
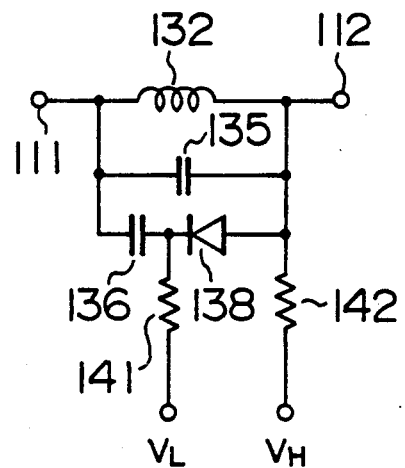

FIGS. 7A, 7B respectively show third an fourth embodiments of the trap circuit, wherein reference numerals 130–132 designate coils, 133–136 capacitors, 137, 138 switching diodes and 139–142 resistors. A parallel resonance circuit composed of the coils 130, 131 and the capacitor 133 in FIG. 7A constitutes a trap circuit while a parallel resonance circuit composed of the coil 132 and the capacitor 135 in FIG. 7B constitutes a trap circuit.

As explained above, according to the present invention, it is possible to remove a disturbance caused by an FM educational channel affecting a received U.S. sixth channel signal as well as a beat disturbance affecting the sixth channel color signal caused by the video carrier, the audio sub-carrier and the oscillation signal of the received U.S. sixth channel signal. Also, the present invention is effective in removing disturbances generally caused by mutual modulation waves and higher harmonic waves.

According to the present invention, a mixer circuit is provided with a mixer in a double balanced mixer structure to improve an anti-distortion and disturbance characteristic and a trap circuit in a simple structure for attenuating distortion components in mutual modulation waves or higher harmonic waves generated in a tuner circuit prior to the mixer circuit, thereby producing effects of improving the anti-distortion and disturbance characteristic and offsetting distortion components converted to an IF band by the mixer circuit with distortion components converted from mutual modulation waves generated by a tuner circuit to the IF band. It is therefore appreciated that the present invention provides a receiver apparatus such as a tuner which exhibits a satisfactory anti-distortion and disturbance characteristic.

What is claimed is:

1. A receiver apparatus having at least a tuner circuit, a mixer circuit, and an oscillator circuit in which the mixer circuit is connected to the tuner circuit at an input side in the receiver and the oscillator circuit;

wherein a trap filter circuit for attenuating a mutual modulation wave or a higher harmonic wave generated by said tuner circuit which receives a plurality of bands is provided between said mixer circuit and said tuner circuit and disposed in a stage prior to said mixer circuit;

wherein said mixer circuit comprises means for offsetting a first spurious signal generated by converting two or more received RF signals to an IF band by said mixer circuit with a second spurious signal generated by converting mutual modulation waves generated by mutually modulating said two or more received RF signals by said tuner circuit to the IF band by said mixer circuit.

2. A receiver apparatus according to claim 1, wherein said mixer circuit is formed by a double balanced mixer circuit.

3. A receiver apparatus according to claim 1, further comprising a resistor for varying a voltage at an input terminal of said mixer circuit.

4. A receiver apparatus according to claim 1, wherein said trap filter circuit comprises:

a first capacitor coupled to a signal path connecting said tuner circuit and said mixer circuit;

a first coil having an end connected to said first capacitor coupled to said signal path on the mixer side;

a second coil having an end connected to an other end of said first coil and the other end connected to the ground;

a second capacitor having an end connected to the other end of said first coil in parallel with said second coil and the other end connected to the ground; and a switching diode.

* * * * *